United States Patent [19]

Patron et al.

[11] Patent Number: 4,884,043
[45] Date of Patent: Nov. 28, 1989

[54] HIGH-FREQUENCY GENERATOR

[75] Inventors: Christian S. A. E. Patron; Eugene J. Sowinski; Aart P. Huben, all of Eindhoven, Netherlands

[73] Assignee: U.S. Philips Corporation, New York, N.Y.

[21] Appl. No.: 218,007

[22] Filed: Jul. 12, 1988

[30] Foreign Application Priority Data

Jul. 16, 1987 [NL] Netherlands ............... 8701678

[51] Int. Cl.$^4$ .................. H03B 5/10; H05B 6/02
[52] U.S. Cl. ........................... 331/186; 315/350; 313/296; 219/10.77
[58] Field of Search ................. 331/185, 186; 219/10.77; 313/296, 297; 315/168, 176, 337, 339, 350, 351

[56] References Cited

U.S. PATENT DOCUMENTS 2,760,075 8/1956 Parker et al. ............... 331/186 X

Primary Examiner—Eugene R. LaRoche
Assistant Examiner—Robert J. Pascal
Attorney, Agent, or Firm—Bernard Franzblau

[57] ABSTRACT

A high-frequency generator 1 includes a multigrid electron tube (2). A current source circuit (10) is connected to the control grid (3) or the screen grid (4) of the electron tube (2) and is arranged as an optionally adjustable current source which is also coupled to the main current path of the electron tube. This circuit defines the grid dissipation and also extends the useful life of the electron tube. If the current source circuit (10) is connected to the screen grid (4), the electron tube is further safeguarded in a simple manner against an inadmissibly high screen grid current accompanying an occasional anode voltage drop.

13 Claims, 1 Drawing Sheet

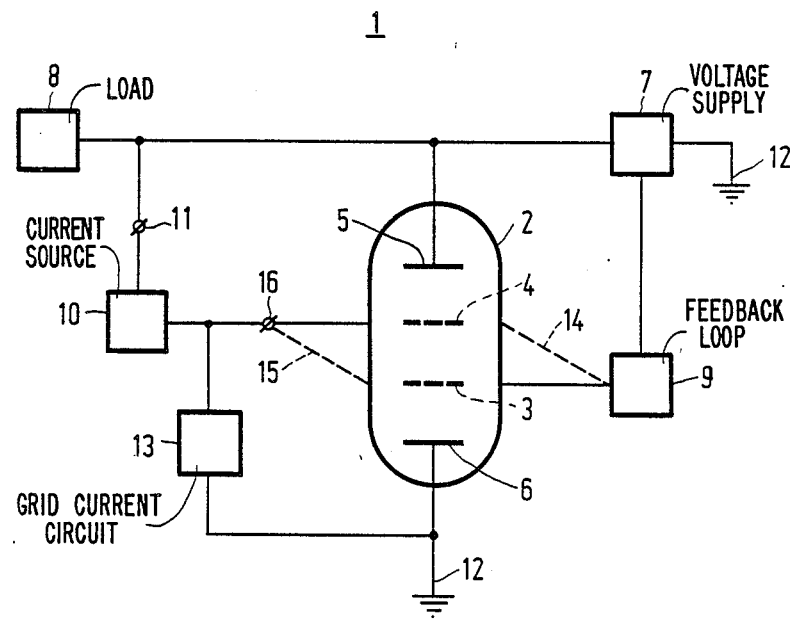

HIGH-FREQUENCY GENERATOR

BACKGROUND OF THE INVENTION

This invention relates to a high-frequency generator, comprising a multigrid electron tube having at least one grid pair, consisting of a control grid and a screen grid, a tube supply circuit and a load, both being connected to the main current path of the electron tube, and a feedback loop. The feedback is connected to the main current path of the electron tube on the one side and to either of the grids of the grid pair on the other, for generating a high-frequency signal in the main current path.

Such a high-frequency generator, which finds its application in industry, for example, for high-frequency heating, is described in the U.S. Pat. No. 4,761,618 dated Aug. 2, 1988.

The high-frequency generator described therein comprises a low-voltage control unit which is connected to a tetrode grid. By means of the low-voltage control unit the voltage level of a control voltage on the relevant grid can be adjusted thereby influencing the output power of the electron tube to be dissipated in the load.

The disadvantage of influencing in this fashion the output power of the electron tube by means of the low-voltage control circuit is the fact that during the operation of the generator conditions may arise in which the electron tube is damaged.

SUMMARY OF THE INVENTION

An object of the invention is to take measures in the high-frequency generator for limiting the grid dissipation in a simple manner and thereby extend the useful life of the electron tube.

In accordance with the invention, the high-frequency generator in a first embodiment of the invention is characterized in that the high-frequency generator comprises a current source circuit, which current source circuit is connected to the remaining grid of the grid pair for defining the grid dissipation in the electron tube.

The invention advantageously uses the concept that when applying current control to the control grid or the screen grid, the grid current is impressed, and cannot increase to such a high value that as a result thereof the electron tube is damaged.

A second embodiment of the invention of the high-frequency generator, in which the feedback loop is connected to the control grid, is characterized in that the current source circuit is connected to the screen grid.

The advantage of the high-frequency generator according to the invention is the fact that without additional safety precautions, the electron tube is protected in a simple manner against an inadmissibly high value of the screen grid current otherwise accompanying an occasional anode voltage drop.

A third embodiment of the invention of the high-frequency generator is characterized in that the current source circuit is arranged as a controllable current source circuit having one control input which is connected to the main current path of the electron tube.

A further advantage of this embodiment is the fact that because the screen grid current is adjustable in this fashion, an operating point of the electron tube can be adjusted such that ratio between the desired dissipation in the load circuit and the dissipation in the electron tube is optimal.

A fourth embodiment of the invention of the high-frequency generator is characterized in that the feedback loop is connected to the screen grid and in that the current source circuit is conected to the control grid.

A still further advantage is the fact that when applying current control to the control grid having a required power value dissipated in the load circuit, a low output voltage of the current control circuit will suffice, which output voltage compared to the use of current control for the screen grid is even of a lower order than the output voltage of the current source circuit required for the latter embodiments.

Another advantage is the fact that, when the output power of the electron tube is situated within a predetermined drive range, the control grid dissipates little power in comparison with the power required when using screen grid power control.

Thus, a generally relatively small voltage or current already suffices to drive the electron tube to full voltage. Not only is the dissipation of the electron tube defined by this, but in addition, the maximum attainable control frequency is increased when the screen grid current is influenced on the basis of frequency control, as a result of which the range of the high-frequency generator is widened and it is made especially suitable for use in laser control.

A fifth embodiment of the invention of the high-frequency generator, in which the current source circuit has one output, is characterized in that the high-frequency generator comprises a grid current circuit inserted between the output of the current source circuit and a common supply voltage junction, for instantaneously influencing the current in the main current path of the electron tube.

A further advantage is the fact that when using the grid current circuit a continuous-pulse or a modulated operation of the high-frequency generator can be realized satisfactorily in a simple manner.

BRIEF DESCRIPTION OF THE DRAWING

The invention and its advantages will be further explained with reference to FIG. 1 showing a block diagram of a high-frequency generator in accordance with the invention.

DESCRIPTION OF THE PREFERRED EMBODIMENTS

FIG. 1 shows a high-frequency generator 1 which is used in industrial processes such as high-frequency heating, for example, in the production of optical fibers such as glass fibers. A further use is found in transmitter tube circuits or laser drives.

The generator 1 comprises a multigrid electron tube 2, such as a tetrode shown in FIG. 1 or a similar multigrid electron tube, such as a pentode, a hexode, a heptode, an octode etc. The electron tube 2 has a least a pair of grids consisting of a control grid 3 and a screen grid 4, and obviously, an anode 5 and a cathode 6. The generator 1 shown in FIG. 1 comprises a tube supply circuit 7, which provides a supply voltage for the electron tube 2, and also includes a load circuit 8. The tube supply circuit 7 and the load 8 are each connected to the anode 5 in FIG. 1. The tube supply circuit 7 is further connected to a common supply voltage junction point 12, for example, ground. The load circuit is formed, for example, by one or more work coils (not shown). The generator 1 further includes a feedback loop 9 connected to the control grid 3 in a first embodiment. The feedback loop 9 is further connected to the main current path of the electron tube 2, for example, by being connected to the anode 5 via the tube supply circuit 7. The feedback loop 9, which makes the electron tube 2 oscillate, is arranged in a manner known to those skilled in the art so as to generate a high-frequency signal in the main current path. The frequency of the high-frequency signal is usually situated between 50 Khz and 50 Mhz.

In order to prevent the grid current, more specifically the screen grid current, from becoming inadmissibly high under specific circumstances, the generator 1 in this first embodiment comprises a current source circuit 10 connected to the screen grid 4. By reducing the screen grid current by means of the current source circuit 10, the dissipation in the screen grid 4 is reduced, as a result of which the chance of damaging this screen grid 4 by too high a screen grid current is reduced too and the useful life of the electron tube 2 is extended.

It is a widely known fact about a multigrid electron tube 2 that when there is an occasional anode voltage drop, the positively charged screen grid 4 receives virtually all of the electrons coming from the cathode. The screen grid 4 then, as it were, assumes the task of the anode 5. The construction of the screen grid 4, however, is not designed for this so that, generally, a safeguard has to be introduced against the anode voltage drop in order to avoid permanent damage to the electron tube 2 in such an event. The advantage of the high-frequency generator in accordance with the invention is the fact that without additional safety precautions the electron tube 2 is automatically safeguarded against such damage by the use of the current source circuit 10.

FIG. 1 is also intended to show a second embodiment of the high-frequency generator 1. In this second embodiment the feedback loop 9 is connected to the screen grid 4 via the dashed line 14 in lieu of being connected to the control grid 3, and the current source circuit 10 then is connected to the control grid 3 via the dashed line 15 in lieu of being connected to the screen grid 4.

In practice it has appeared that when the current control is used for the control grid 3 in this second embodiment, a lower output voltage of the current source circuit 10 will suffice than is required for the screen grid control in the first embodiment described hereinbefore. It has further appeared that with a required drive range of the output power of the electron tube 2, measured across the load circuit 8, the control grid current that is then required is small compared to the current required in the case of screen grid control. As a result, in the second embodiment a further reduction of the grid dissipation is effected as compared to the first embodiment of the high-frequency generator 1.

In addition, it has been found in practice that in this second embodiment the maximum attainable control frequency is higher than in the first embodiment when influencing the current of the control grid with the aid of current source circuit 10 on the basis of frequency control. Herewith a widening of the range of the high-frequency generator 1 is realized so that the latter is preeminently suitable for use in laser control because, generally, a higher control frequency is required for laser control.

An explanation of the higher control frequency is the fact that the capacitors, which are generally present in the current source circuit 10, are connected to either the control grid 3 or the screen grid 4 depending on the embodiment of generator 1, and carry a direct voltage in the second embodiment, which is lower too as a consequence of the required lower output voltage of the current source circuit 10. Consequently, the discharging of these capacitors will take a shorter period of time when influencing the control grid current by means of frequency control, which leads to a rise in the maximum attainable control frequency.

In a third embodiment of the high-frequency generator, the current source circuit 10 is further connected to the main current path of the electron tube 2. The current source circuit 10 now comprises a control input 11 which is connected to the anode 5 in FIG. 1. By utilizing an adjustable current source circuit 10 by means of a control voltage applied to control input 11, it is now possible to adjust the value of the current supplied by the current source circuit 10 as a function of the dissipation in load 8. In addition, it is possible to influence and select the operating point of the electron tube in the aforesaid first and second embodiment of the generator 1 by adjusting the value of the screen or control grid current by means of the adjustable current source circuit 10, for example, to optimize the ratio between the desired dissipation in load circuit 8 and the dissipation in the electron tube.

In a fourth embodiment the high-frequency generator 2 comprises a grid current circuit 13. The grid current circuit 13 is inserted between an output 16 of the current source circuit 10 and the common supply voltage junction 12. It is the function of the grid current circuit 13, depending on the embodiment of generator 1, to instantaneously influence the control grid current or the screen grid current, and consequently the current flowing through load 8. For this purpose the grid current circuit 13, in a manner not shown in the diagram, can comprise a pulse circuit for conducting the current supplied by the current source circuit 10 to point 12 at desired points of time, in order to operate the electron tube 2 in a pulsed mode, or may comprise a circuit (not shown) for continuously affecting the screen grid current in a desired manner. By means of the grid current circuit 13, it is possible to influence the current of one of the grids of the grid pair, if desired in a combination or not in a combination with the optionally controllable current source circuit 10, and hence influence the current in the main current path of the electron tube 2, for example, on the basis of frequency control.

We claim:

1. A high-frequency generator comprising a multigrid electron tube having at least one grid pair including a control grid and a screen grid, a tube supply circuit and a load each being connected to a main current path of the electron tube, a feedback loop for generating a high-frequency signal in the main current path, said feedback loop being connected to the main current path of the electron tube and to one of the grids of the grid pair, and a current source circuit connected to the remaining grid of the grid pair for defining the grid dissipation in the electron tube.

2. A high-frequency generator as claimed in claim 1, wherein the feedback loop is connected to the control grid and the current source circuit is connected to the screen grid.

3. A high-frequency generator as claimed in claim 2, wherein the current source circuit comprises a controllable current source circuit having a control input connected to the main current path of the electron tube.

4. A high-frequency generator as claimed in claim 1, wherein the feedback loop is connected to the screen grid and the current source circuit is connected to the control grid.

5. A high-frequency generator as claimed in claim 1, wherein the current source circuit comprises a controllable current source circuit having a control input connected to the main current path of the electron tube.

6. A high-frequency generator comprising: a multi-grid electron tube having first and second electrodes that define a main current path in the tube and a pair of grids including a control grid and a screen grid,
   a DC supply voltage circuit coupled to said first and second tube electrodes,
   means coupling a load to said tube main current path,
   a feedback loop for generating a high-frequency signal in the main current path, said feedback loop having a first terminal coupled to the main current path and a second terminal coupled to one of the grids of said pair of grids, and
   a current source connected to the other one of said pair of grids thereby to define and limit the grid dissipation in the electron tube.

7. A high-frequency generator as claimed in claim 6 wherein said electron tube comprises a tetrode tube having only two grids, said control grid and said screen grid.

8. A high-frequency generator as claimed in claim 6 wherein said current source includes a control input coupled to the main current path of the electron tube for controlling current flow in said current source and in said other one of said pair of grids as a function of load current.

9. A high-frequency generator as claimed in claim 8 further comprising a grid current circuit coupled between an output of said current source and a common junction point of the DC supply voltage circuit and arranged to instantaneously control current in the main current path of the electron tube.

10. A high-frequency generator as claimed in claim 6 further comprising a grid current circuit coupled between an output of said current source and a common junction point of the DC supply voltage circuit and arranged to instantaneously control current in the main current path of the electron tube.

11. A high-frequency generator as claimed in claim 6 wherein said one grid comprises the screen grid and said other one of said pair of grids comprises the control grid.

12. A high-frequency generator as claimed in claim 6 wherein said one grid comprises the control grid and said other one of said pair of grids comprises the screen grid.

13. A high-frequency generator as claimed in claim 1 wherein the current source circuit has one output, and further comprising a grid current circuit coupled between the output of the current source circuit and a common supply voltage junction for instantaneously influencing current in the main current path of the electron tube.

* * * * *